(12) United States Patent
Wang et al.

(10) Patent No.: US 7,576,007 B2
(45) Date of Patent: Aug. 18, 2009

(54) METHOD FOR ELECTROCHEMICALLY MECHANICALLY POLISHING A CONDUCTIVE MATERIAL ON A SUBSTRATE

(75) Inventors: You Wang, Cupertino, CA (US); Zhihong Wang, Santa Clara, CA (US); Renhe Jia, Berkeley, CA (US); Stan D. Tsai, Fremont, CA (US); Yongqi Hu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 489 days.

(21) Appl. No.: 11/328,958

(22) Filed: Jan. 9, 2006

(65) Prior Publication Data

US 2007/0161250 A1 Jul. 12, 2007

(51) Int. Cl.
*H01L 21/302* (2006.01)
(52) U.S. Cl. ............... 438/690; 257/E21.304
(58) Field of Classification Search ......... 438/689–694; 257/E21.304
See application file for complete search history.

(56) References Cited

U.S. PATENT DOCUMENTS

| | | | |
|---|---|---|---|
| 6,811,680 B2 | 11/2004 | Chen et al. | |
| 6,863,797 B2 | 3/2005 | Sun et al. | |
| 6,899,804 B2 | 5/2005 | Duboust et al. | |
| 7,128,825 B2 | 10/2006 | Liu et al. | |
| 7,160,432 B2 * | 1/2007 | Liu et al. | 205/647 |
| 7,229,535 B2 | 6/2007 | Wang et al. | |
| 7,390,744 B2 * | 6/2008 | Jia et al. | 438/689 |
| 2002/0130049 A1 | 9/2002 | Chen et al. | |
| 2003/0116445 A1 | 6/2003 | Sun et al. | |
| 2003/0116446 A1 | 6/2003 | Duboust et al. | |
| 2003/0178320 A1 | 9/2003 | Liu et al. | |
| 2003/0216045 A1 | 11/2003 | Wang et al. | |
| 2003/0234184 A1 | 12/2003 | Liu et al. | |
| 2004/0053499 A1 | 3/2004 | Liu et al. | |
| 2004/0248412 A1 | 12/2004 | Liu et al. | |
| 2005/0218010 A1 | 10/2005 | Wang et al. | |
| 2006/0006074 A1 | 1/2006 | Liu et al. | |
| 2006/0102872 A1 | 5/2006 | Liu et al. | |
| 2006/0169597 A1 | 8/2006 | Liu et al. | |
| 2006/0249394 A1 | 11/2006 | Jia et al. | |
| 2006/0249395 A1 | 11/2006 | Wang et al. | |
| 2007/0290166 A1 | 12/2007 | Liu et al. | |

\* cited by examiner

*Primary Examiner*—Brook Kebede
(74) *Attorney, Agent, or Firm*—Patterson & Sheridan (57) ABSTRACT

Aspects of the present invention include a method and an apparatus that may be utilized to reduce dishing and improve cleaning efficiency of a material layer residue (e.g., copper residual) by varying a substrate potential in a substrate processing system. For example, by utilizing multiple polishing steps and applying different voltages (e.g., while a substrate is being in a polishing station), ECMP can be used to effectively reduce dishing and it can be used to enhance copper residual cleaning as well as minimizing a possibility of arcing, which can occur at the end of the polishing process, when a substrate is moved from a polishing station.

16 Claims, 8 Drawing Sheets

$t_p$ : TIME FOR POLISHING $t_c$ : TIME FOR CLEAN Cu RESIDULAL AT SECOND PASSIVATION STATE $t_d$ : TIME FOR DISCHARGING PAD AND WAFER SURFACE AT OPEN CIRCUIT POTENTIAL

FIG. 8

METHOD FOR ELECTROCHEMICALLY MECHANICALLY POLISHING A CONDUCTIVE MATERIAL ON A SUBSTRATE

BACKGROUND OF THE INVENTION

1. Field of the Invention

The present invention relates generally to processing substrates, and more particularly to methods and apparatuses for removing material from a substrate.

2. Description of the Related Art

Reliably producing sub-half micron and smaller features in semiconductor substrates is one of the key technologies for the next generation of very large scale integration (VLSI) and ultra large-scale integration (ULSI) of semiconductor devices. However, as the limits of circuit technology are pushed, the shrinking dimensions of interconnects in VLSI and ULSI technology have placed additional demands on semiconductor manufacturing capabilities. Reliable formation of interconnects is important to the processing of VLSI and ULSI successes and to the continued effort to increase circuit density and quality of individual substrates.

In general, multilevel interconnects are formed using sequential material deposition and material removal techniques on a substrate surface to form features therein. As layers of materials are sequentially deposited and removed, the uppermost surface of the substrate may become non-planar across its surface and require planarization prior to further processing. Planarization or "polishing" is a process in which material is removed from the surface of the substrate to form a generally even, planar surface. Planarization is useful in removing excess deposited material, removing undesired surface topography, and surface defects, such as: surface roughness, agglomerated materials, crystal lattice damage, scratches, and contaminated layers or materials in order to provide an even surface for subsequent photolithography and other semiconductor manufacturing processes.

It is extremely difficult to planarize a metal surface (e.g., copper surface) by electrochemical mechanical polishing (ECMP), which planarizes a layer, by electrical and chemical activity as well as mechanical activity, of a damascene inlay with a high degree of surface planarity. A damascene inlay formation process may include etching feature definitions in an interlayer dielectric, such as a silicon oxide layer, depositing a barrier layer in the feature definitions and on a surface of the substrate, and depositing a thick layer of conductive material, such as copper, on the barrier layer and substrate surface. The copper material is electrochemically and mechanically polished to expose the barrier layer and the copper filled feature definitions or "plugs." However, electrochemical mechanical polishing of the copper material to remove excess copper material above the substrate surface often results in non-planar topographical defects, such as dishing and erosion, that may affect subsequent processing of the substrate.

Figure 1:
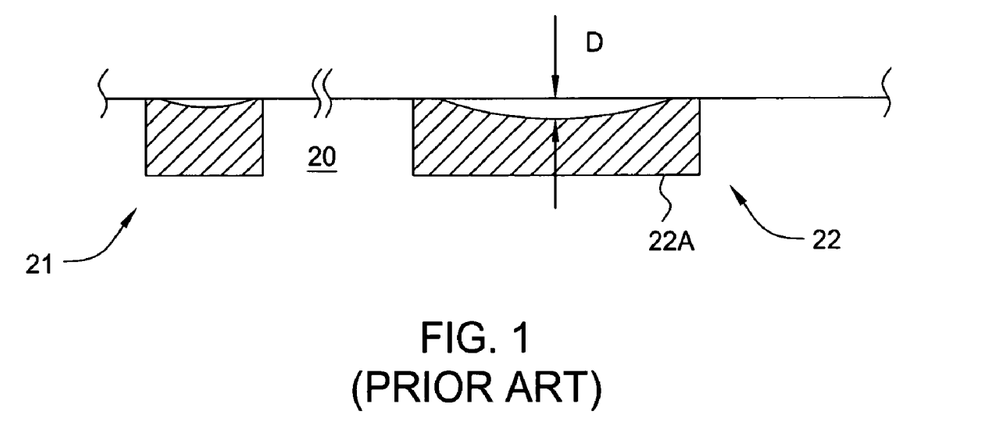
FIG. 1 is a schematic illustration of a dishing phenomenon.

Dishing occurs when a portion of the surface of the inlaid metal of the interconnection, formed in the feature definitions in the interlayer dielectric is excessively polished, resulting in one or more concave depressions, which may be referred to as concavities or recesses. As shown in FIG. 1A, a damascene inlay of conductive lines 21 and 22 are formed by depositing a metal, such as copper or tungsten or a tungsten alloy, in a damascene opening formed in an interlayer dielectric 20, for example, silicon dioxide. While not shown, a barrier layer of a suitable material such as titanium and/or titanium nitride may be deposited between the interlayer dielectric 20 and the inlaid metal 22A. Subsequent to planarization, a portion of the inlaid metal 22A may be depressed by an amount D, referred to as the amount of dishing.

Therefore, there is a need for methods and an apparatus for removing conductive material, such as excess copper material, from a substrate that minimizes the formation of non-planar topographical defects to the substrate during planarization.

SUMMARY OF THE INVENTION

One embodiment provides a method for electrochemical mechanical polishing of a substrate having a dielectric feature, a barrier layer comprising a barrier material disposed on the dielectric feature, and a conductive material disposed on the barrier material. The method generally includes prior to exposing the barrier layer, polishing the conductive material while applying a first biasing potential across a conductive surface of the substrate and a counter electrode to expose the barrier material, and after the barrier layer is at least partially exposed, polishing the conductive material while applying a second biasing potential across a conductive surface of the substrate and the counter electrode, wherein the second biasing potential is selected to compensate for a potential drop across the barrier material.

Another embodiment provides a substrate polishing apparatus. The substrate polishing apparatus generally includes one or more polishing stations, a power supply adapted to provide variable biasing potentials to the one or more polishing stations, and a controller adapted to adjust the biasing potentials for the one or more of the polishing stations in order to apply a first biasing potential across a conductive surface of a substrate and a counter electrode to expose a barrier material and apply a second biasing potential across the conductive surface of the substrate and the counter electrode, wherein the second biasing potential is selected to compensate for a potential drop across the barrier material.

Another embodiment provides a method for electrochemical mechanical polishing of a substrate having a dielectric feature, a barrier layer comprising a barrier material disposed on the dielectric feature, and a conductive material disposed on the barrier material. The method includes prior to exposing the barrier layer, polishing the conductive material while applying a first biasing potential across a conductive surface of the substrate and a counter electrode to expose the barrier material, wherein the first biasing potential corresponds a first passivation state of the conductive material layer, after the barrier layer is at least partially exposed, polishing the conductive material while applying a second biasing potential across a conductive surface of the substrate and the counter electrode, wherein the second biasing potential corresponds to a second passivation state of the conductive material layer, and applying a third biasing potential to discharge an accumulated charge on the surface from a polishing pad.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide methods and apparatus that may be utilized to reduce dishing and improve cleaning efficiency of copper residual by varying a substrate potential in a substrate processing system. For example, by utilizing multiple polishing steps and applying different voltages (e.g., while a substrate is being in a polishing station), ECMP can be used to effectively reduce dishing and it can be used to enhance copper residual cleaning as well as minimizing a possibility of arcing, which can occur at the end of the polishing process, when a substrate is moved from a polishing station.

While the description of the system is described with reference to an ECMP apparatus and method for planarization, the same technique may be applied to other polishing methods such as electropolishing.

The electrochemical mechanical polishing process may be performed in a process apparatus, such as a platform having one or more polishing stations adapted for ECMP processes. In addition, one or more polishing stations may be adapted to perform conventional chemical mechanical polishing. A polishing station for performing an ECMP process may include a polishing article, a contact surface, and a counter electrode, wherein the substrate is in electrical contact with the counter electrode and the contact surface. An example of a suitable system is the Reflexion Lk Ecmp™ processing system, commercially available from Applied Materials, Inc., of Santa Clara, Calif.

Figure 2:
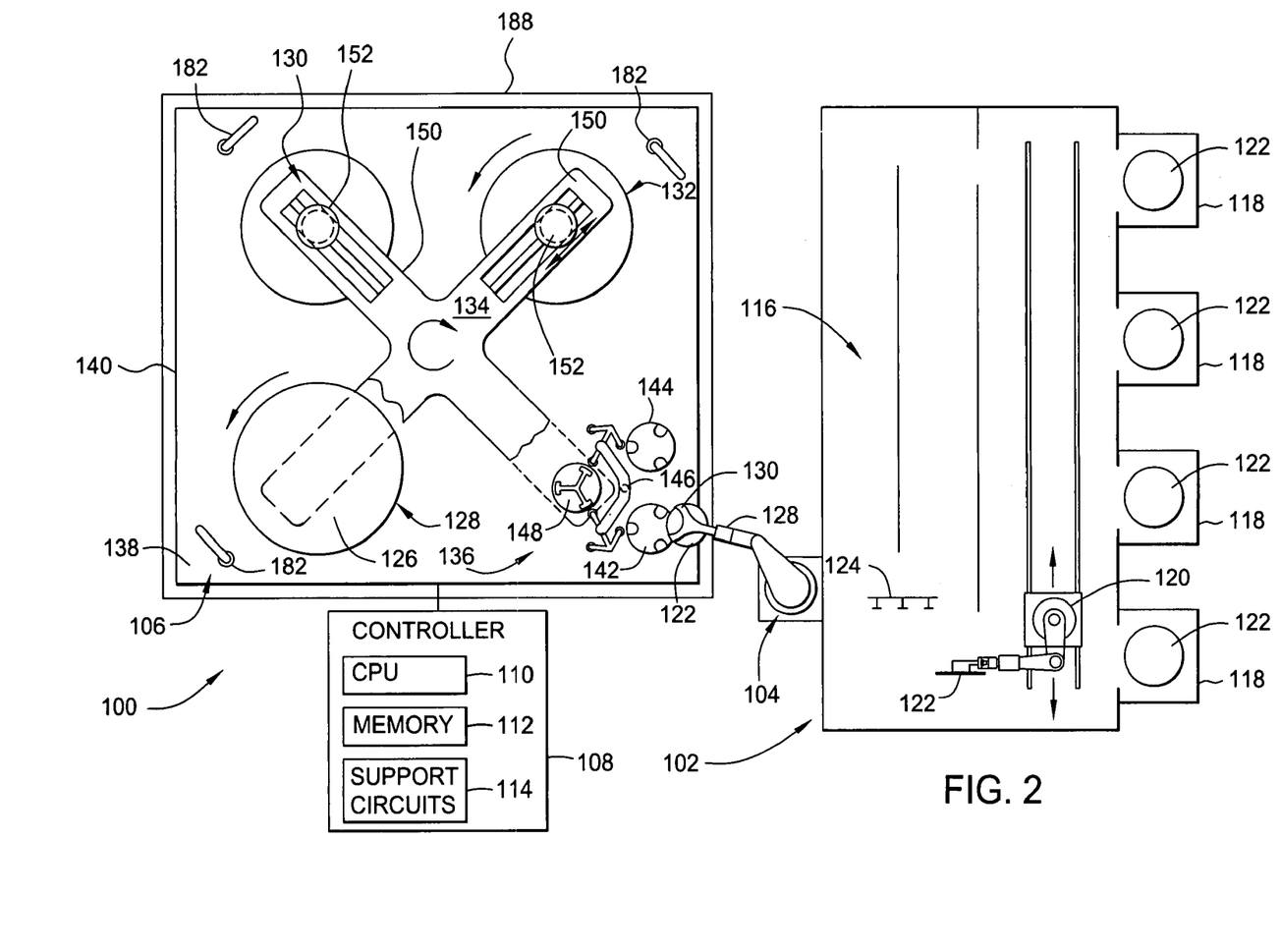
FIG. 2 is a plan view of an electrochemical mechanical planarizing (ECMP) system.

FIG. 2 illustrates a plan view of one embodiment of a planarization system 100 having an apparatus for electrochemically processing a substrate. The exemplary system 100 generally comprises a factory interface 102, a loading robot 104, and a planarizing module 106. The loading robot 104 is disposed proximate to the factory interface 102 and the planarizing module 106 to facilitate the transfer of substrates 122 therebetween.

A controller 108 is provided to facilitate control and integration of the modules of the system 100. The controller 108 comprises a central processing unit (CPU) 110, a memory 112, and support circuits 114. The controller 108 is coupled to the various components of the system 100 to facilitate control of, for example, the planarizing, cleaning, transfer processes between substrate polishing stations 128, 130, and 132. In addition, controller 108 may be adapted to apply different polarization potentials (voltages), while the substrate is in a polishing station (e.g., polishing station 130), possibly in an effort to achieve improved planarization, as described herein.

The factory interface 102 generally includes a cleaning module 116 and one or more substrates cassettes 118. An interface robot 120 is employed to transfer substrates 122 between the substrate cassettes 118, the cleaning module 116 and an input module 124. The input module 124 is positioned to facilitate transfer of substrates 122 between the planarizing module 106 and the factory interface 102 by grippers, for example vacuum grippers or mechanical clamps (not shown).

The planarizing module 106 includes at least one electrochemical mechanical planarizing (ECMP) station 130, disposed in an environmentally controlled enclosure 188. Examples of planarizing modules 106 that can be adapted to benefit from the invention include MIRRA® Chemical Mechanical Planarizing Systems, MIRRA MESA™ Chemical Mechanical Planarizing Systems, REFLEXION® Chemical Mechanical Planarizing Systems, REFLEXION® LK Chemical Mechanical Planarizing Systems, and REFLEXION LK ECMP™ Chemical Mechanical Planarizing Systems, all available from Applied Materials, Inc. of Santa Clara, Calif.

In the embodiment illustrated in FIG. 2, the planarizing module 106 includes one bulk ECMP station 132, a second ECMP station 130 and third polishing station 128. The third polishing station 128 may be an ECMP station as described for ECMP stations 132 or 130 as shown in FIG. 2, and may alternatively, be a chemical mechanical polishing (CMP) station.

Bulk removal of conductive material from the substrate is performed through an electrochemical dissolution process at the bulk ECMP station 132. After the bulk material removal at the bulk ECMP station 132, residual conductive material is removed from the substrate at the residual ECMP station 130 through a second electrochemical mechanical process. It is contemplated that more than one residual ECMP stations 130 may be utilized in the planarizing module 106. Barrier layer material may be removed at third polishing station 128 after processing at the residual ECMP station 130 by the barrier removal processes. Alternatively, each of the first and second ECMP stations 132, 130 may be utilized to perform both the two-step conductive material removal as described herein on a single station.

The substrate polishing system includes a carousel 134 that is centrally disposed on the base 140. The carousel 134 typically includes a plurality of arms 150, each supporting a planarizing head assembly 152. Two of the arms 150 depicted in FIG. 2 are shown in phantom such that the transfer station 136 and a planarizing surface 126 of the third polishing station 128 may be seen. The carousel 134 is indexable such that the planarizing head assemblies 152 may be moved between the polishing stations 132, 130, 128 and the transfer station 136.

Figure 3:
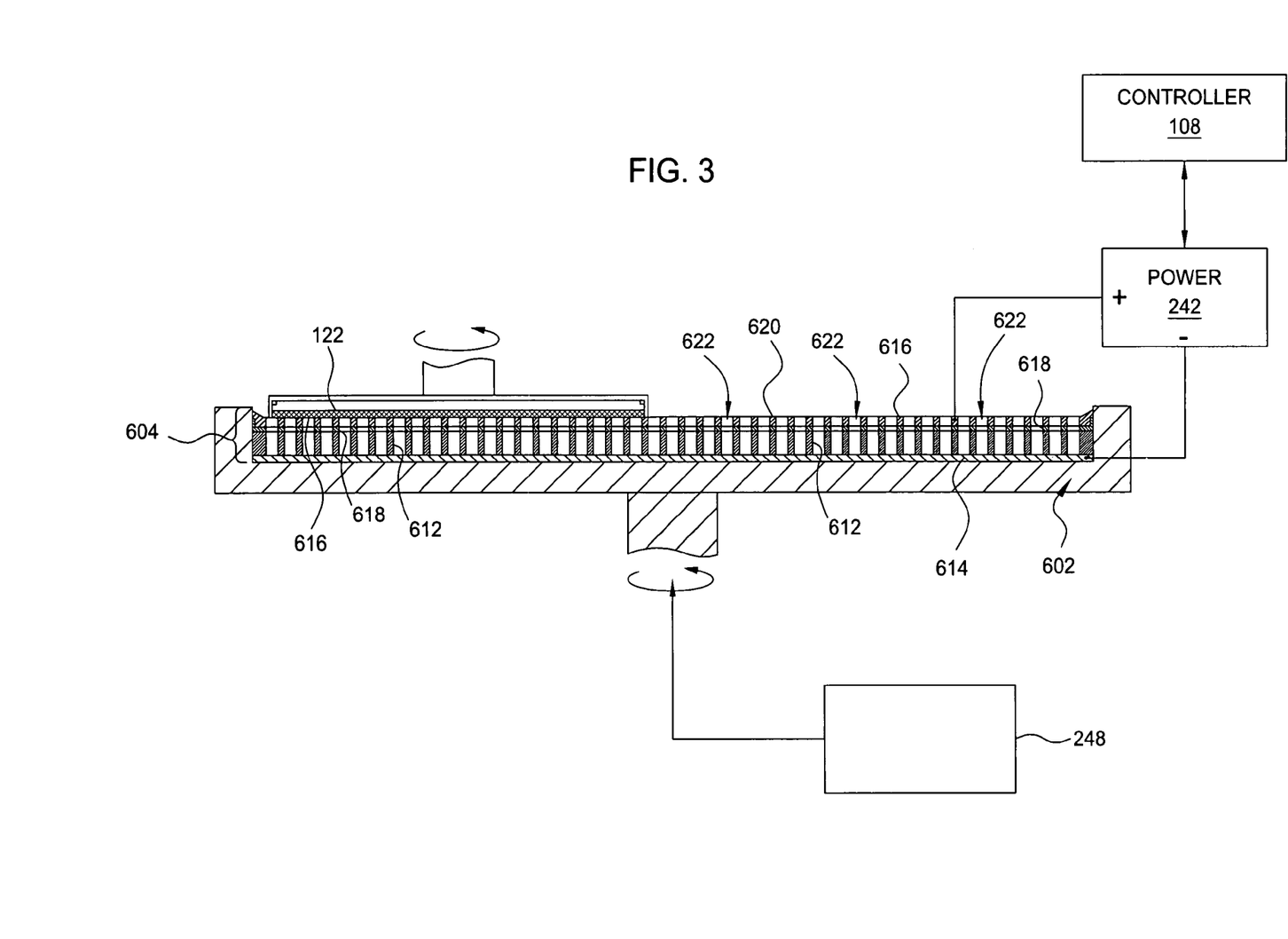
FIG. 3 illustrates a vertical sectional view of an embodiment of an ECMP station.

FIG. 3 illustrates a sectional view of one embodiment of the second ECMP station 130. The first and third polishing stations 128, 132 may be configured similarly. The second ECMP station 130 generally includes a platen 602 that supports a fully conductive processing pad assembly 604. The platen 602 may be configured to deliver electrolyte through the processing pad assembly 604, or alternatively, the platen 602 may have a fluid delivery arm (not shown) disposed adjacent thereto configured to supply electrolyte to a planarizing surface of the processing pad assembly 604. The platen assembly 602 may include at least one sensor (not shown) to facilitate endpoint detection.

In one embodiment of the present invention, the processing pad assembly 604 includes bonding material 612, sandwiched between a conductive reinforcement mesh 618 and a counter electrode 614. The processing pad assembly 604 is generally permeable or perforated to allow electrolyte to pass between the counter electrode 614 and top surface 620. In one embodiment of the present invention, as shown in FIG. 3, the processing pad assembly 604 is perforated by apertures 622 to allow electrolyte to flow therethrough.

In one embodiment of the present invention, a conductive reinforcement mesh 618 may be disposed between electrical contact surface 616 and insulation and bonding material 612. The electrical contact surface 616 is coupled to a power source 242 and provides uniform distribution of different voltages applied by the power source 242 across the electrical contact surface 616.

In one embodiment, the power source 242 is a direct current (DC) power supply. However, the power source 242 may also be an alternating current (AC) power supply. The power source 242 is particularly adapted to apply voltage or current flow through the electrolyte.

Modulating Biasing Voltage

In one embodiment of the present invention, the power source 242 is adapted and controlled by controller 108 to vary the voltage across counter electrode 614 and the electrical contact surface 616, while a substrate is being polished in a polishing station (e.g., polishing station 130). As described herein, the biasing voltage may be modulated in a manner determined by electrochemical behavioral properties of the material being removed (e.g., copper or tungsten).

Figure 4:
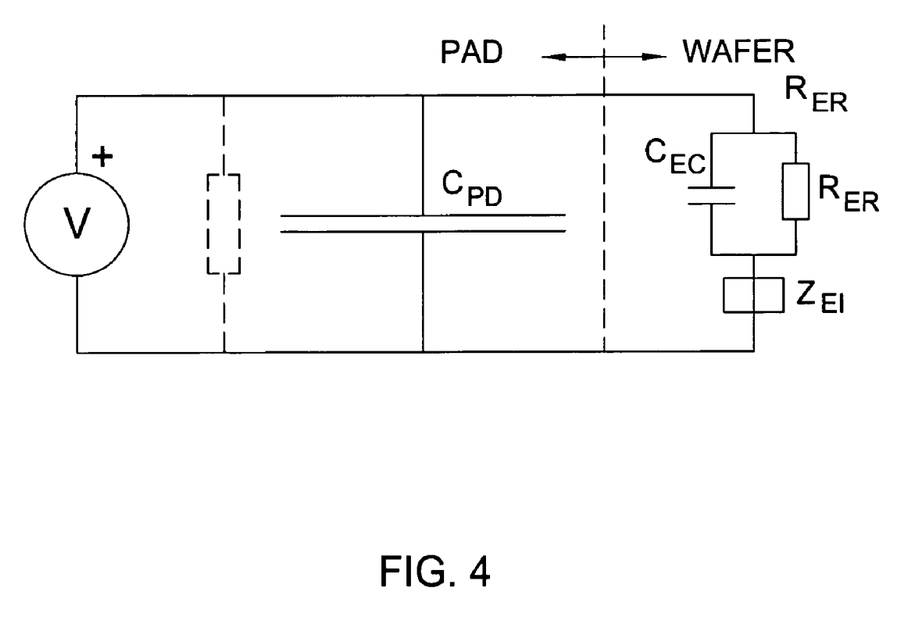
FIG. 4 illustrates an ECMP model while discharging, at the end of the process, according to an embodiment of the present invention.

FIG. 4 illustrates an equivalent circuit of an electrochemical reaction for the system shown in FIG. 3, according to an embodiment of the present invention. In the equivalent circuit shown in FIG. 4, $C_{PD}$ represents the capacitance formed by the electrical contact surface 616 and the counter electrode 614; $C_{EC}$ represents the double layer capacitance on the top surface 620; $R_{ER}$ represents the electrochemical reaction resistance of the chemistry in an ECMP station (e.g., ECMP station 130). In addition, $Z_{EI}$ represents the total impedance between the counter electrode 614 and the top surface 620.

As described herein, based on the electrochemical characteristics of the material (e.g., copper or tungsten) that is being polished, the value of one of more of $C_{PD}$, $C_{EC}$, $R_{ER}$, and $Z_{EI}$ may change during a polishing process. In some embodiment of the present invention, in order to compensate for these changes, the biasing potential applied across the electrical contact surface 616 and the counter electrode 614 may be varied. In one embodiment of the present invention, the biasing potential (V) may be varied once a barrier layer 11 is exposed to compensate for the voltage (IR) drop across conductive barrier on the substrate. In another embodiment of the present invention, V may be varied to a negative voltage to discharge the charges collected on the substrate. In this embodiment, the possibility of local pitting and Sn (metal) transfer that could result from the charge build up is avoided.

Figure 5:
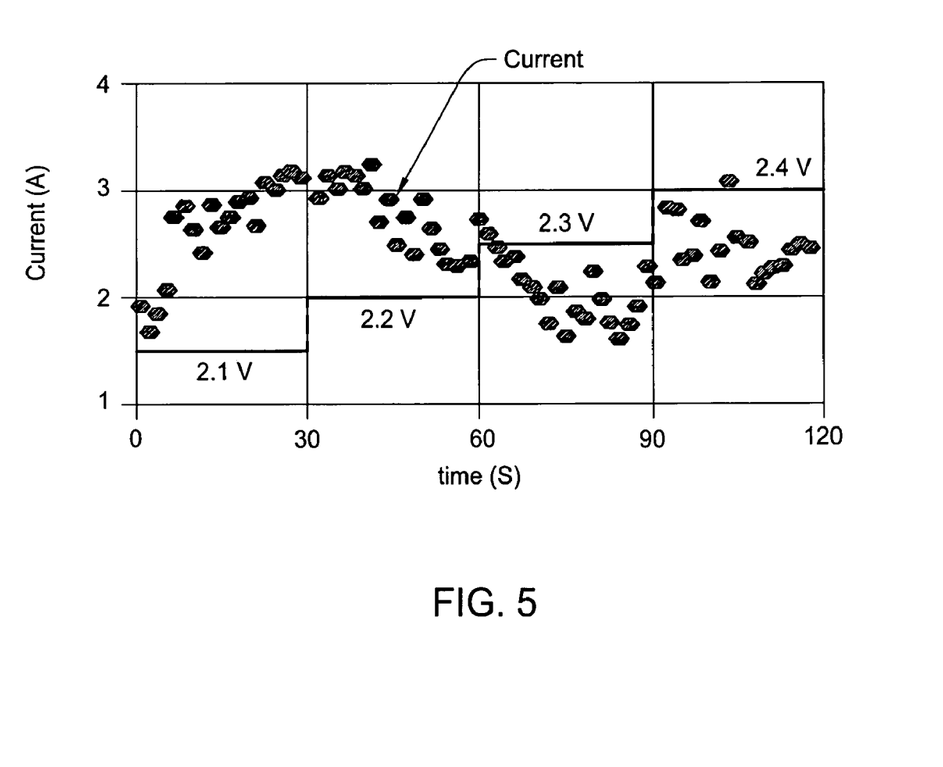
FIG. 5 is a graphical representation of the electrochemical behavior of copper in an ECMP station.

FIG. 5 is a graphical representation of the electrochemical behavior of copper in a polishing station of an ECMP system (e.g., polishing station 130), according to an embodiment of the present invention. As shown in FIG. 4, copper's anodic polarization is characterized by its active dissolution at polarization below 2.1V. With increased polarization, the copper surface becomes passive again. In one embodiment of the present invention, this change is caused by synergistic passivation between two additives of high molecular polymers, such as Polyetherimide (PEI, Mw=750000) and a co-polymer, such as L-2001 in the polishing chemistry. There are two characteristic polarization potentials corresponding to maximum active dissolution current and passivation. In one embodiment of the present invention, the polarization potentials corresponding to maximum active dissolution and passivation are respectively about 2.1V and 2.3V. Both active dissolution and passivation states occur at relatively higher polarization potential in comparison with the electrochemical behavior of copper in commercial copper ECMP chemistries, such as EP 3.1. In standard commercial copper ECMP chemistries, no second passivation of copper surface is observed and active dissolution starts below 1.2V. Those skilled in the art will recognize that the properties of the electrochemical composition and the copper anodic dissolution may be varied depending on the material and additives used in the chemistry of a polishing step. And further, those skilled in the art will recognize that the biasing voltages applied may be adjusted accordingly.

Figure 6A:
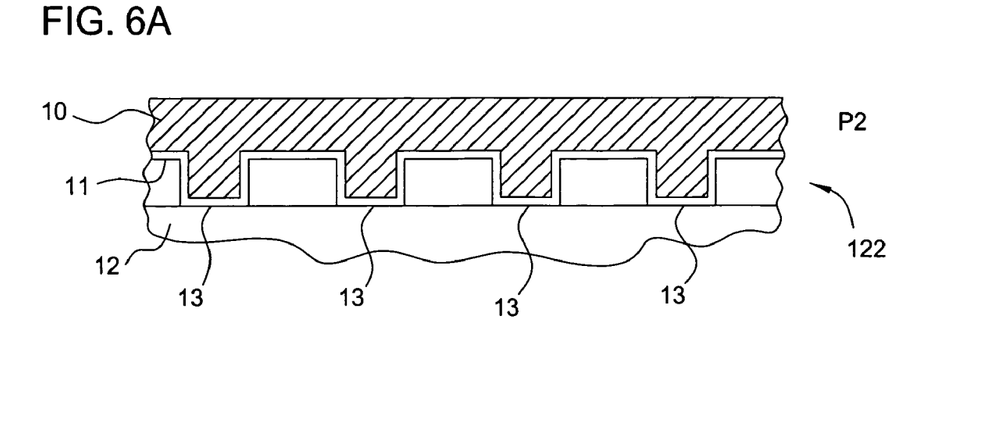
FIGS. 6A-6C illustrate a schematic cross-sectional view of a feature found on a substrate with a barrier layer and a material layer on top at various processing steps, in accordance with one embodiment of the present invention.
Figure 6B:
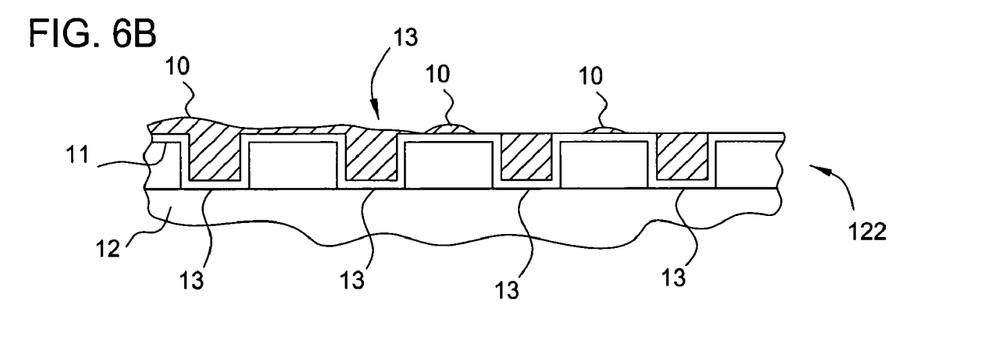
Figure 6C:
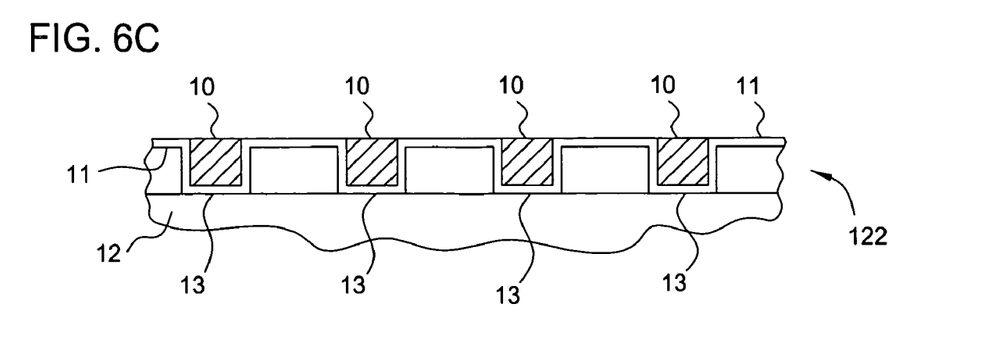

FIGS. 6A-6C illustrate schematic cross-sectional views at various times during a polishing process for planarizing a substrate surface according to an embodiment of present invention. Generally, a first ECMP process may be used to remove bulk copper material from the substrate (not shown) and then a second ECMP process in a second ECMP station (e.g., polishing station 130) may be used to remove residual materials, as shown from FIGS. 5A-5C. In another embodiment of the present invention, the bulk removal process and residual removal process may be performed in the same polishing station (e.g., polishing station 130) both as one process step.

FIG. 6A illustrates a substrate 122 with a barrier layer 11 between a copper layer 10 and a dielectric layer 12 before a polishing step, according to an embodiment of the present invention. As shown, substrate 122 has a dielectric layer 12 patterned with feature definitions 13. The feature definitions, such as: vias, trenches, contacts, or holes, are patterned and etched into the dielectric layer 12 by conventional photolithographic and etching techniques. A barrier material, for example titanium and/or titanium nitride is deposited as a barrier layer 11 on feature definitions 13. Sufficient conductive material is deposited on the substrate surface, on top of barrier layer 11, to fill the feature definitions 13. FIG. 6B illustrates substrate 122 after a first polishing step, utilizing an ECMP polishing station (e.g., polishing station 130) for removing a material layer (e.g., copper) with the barrier layer 11 partially exposed. FIG. 6C illustrates substrate 122 after a second polishing step, utilizing an ECMP polishing station (e.g., polishing station 130) for removing a material layer (e.g., copper) with the entire barrier layer 11 exposed.

Figure 7:
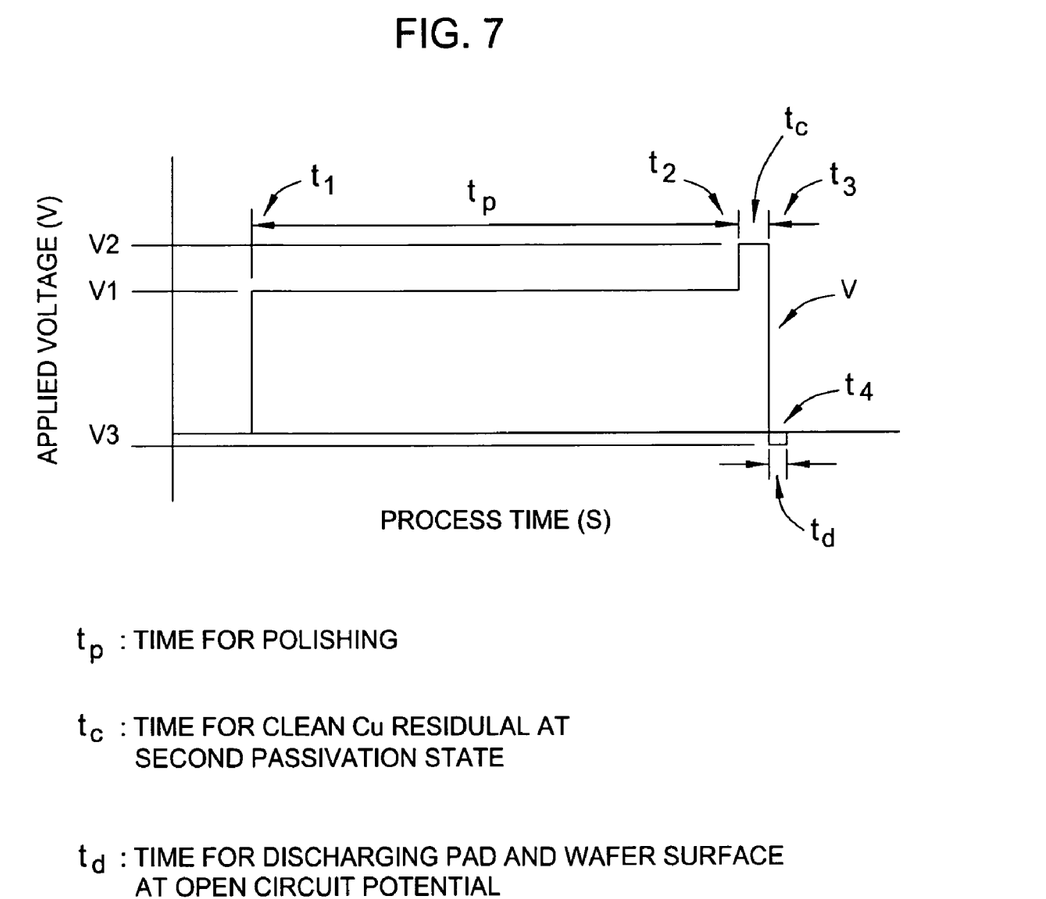
FIG. 7 illustrates an exemplary timing diagram showing controlled variation of biasing voltage for an exemplary ECMP method according to an embodiment of the present invention.

As will be described with reference to FIGS. 4 and 7, different biasing voltages may be applied to the substrate: when initially processing the full copper layer (FIG. 6A), once the barrier layer has been exposed (FIG. 5B), and after the barrier layer is fully exposed (FIG. 6C). For one embodiment, a first bias potential may be applied while polishing the substrate until the barrier layer is partially exposed, causing a voltage (IR) drop across the conductive barrier. At that time, a second bias potential may be applied to compensate for this voltage drop until the entire barrier layer is exposed. Prior to removing the pad from the substrate, a third (negative) bias potential may be applied to remove accumulated charge and avoid a potentially damaging discharge upon removal.

Exemplary Operations

Figure 8:
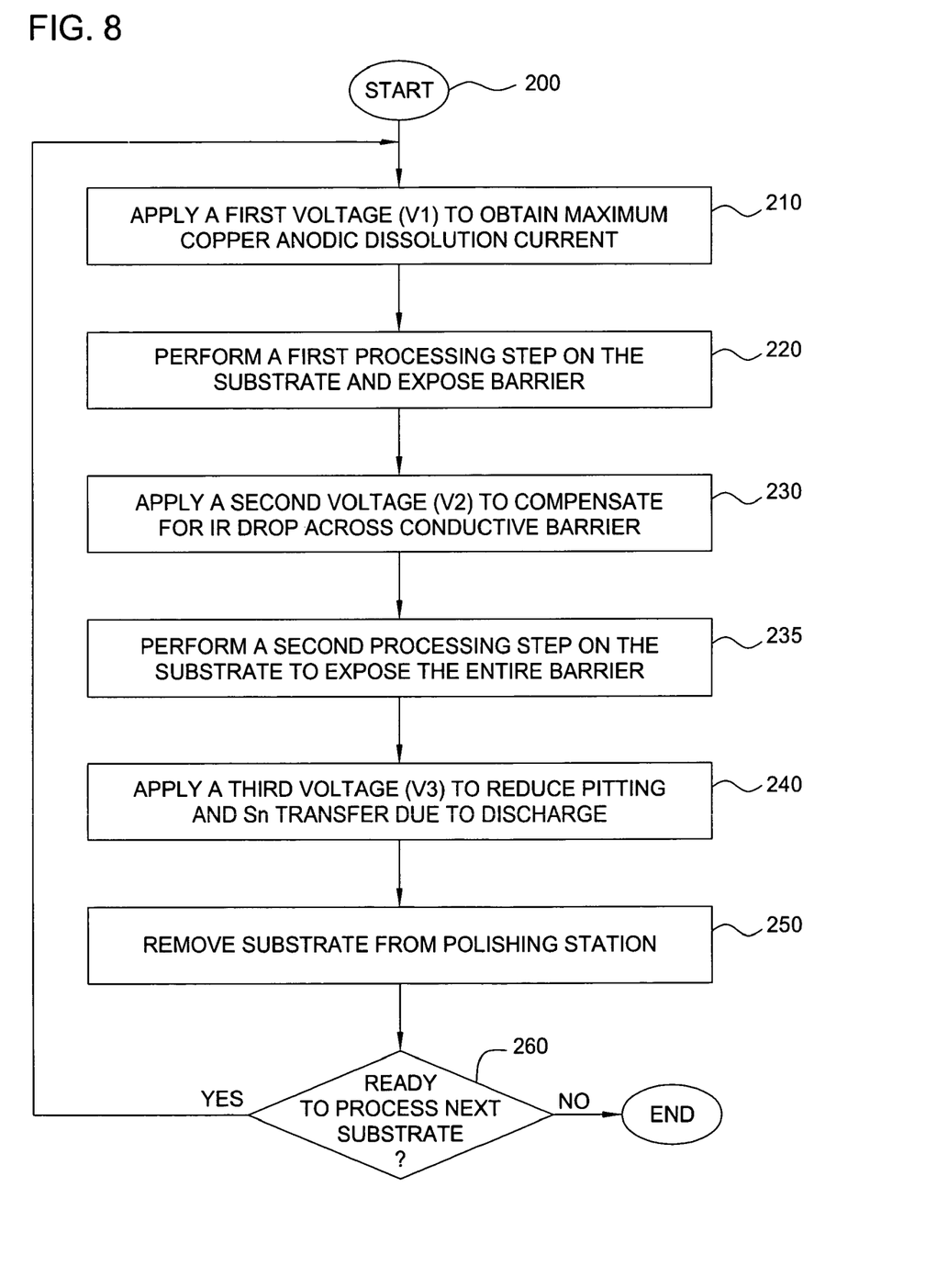
FIG. 8 depicts a flow diagram of a processing method according to an embodiment of the present invention.

FIG. 8 illustrates operations 200 according to an implementation of the present invention. The operations of 200 may be performed, for example, by the controller 108. The operations may be best understood with simultaneous reference to FIG. 6, which illustrates an exemplary timing diagram of the biasing voltage according to an embodiment of the present invention.

The operations begin, at step 210, by applying a first biasing potential (V1) to electrical contact surface 616 of a substrate, for example, while polishing the substrate in a polishing station. The first biasing potential may be selected to obtain a maximum copper anodic dissolution current (e.g., to achieve a relatively rapid removal rate before the barrier layer is exposed) As illustrated in FIG. 7, the reference $t_1$ represents the initial application time of this first potential, and the first potential may be applied for a processing period $t_p$. In one embodiment of the present invention, the first polishing layer of material is copper, and the first bias potential may be selected in an effort to obtain a maximum copper anodic dissolution (e.g., approximately 2.0V).

At step 220, the substrate is processed as V1 is continuously applied to electrical contact surface 616 of a substrate 122 in an ECMP polishing station (e.g., polishing station 130). For the processing, the controller 108 may set the polishing time for the substrate to a fixed duration (time period $t_p$) and substrate 122 may be processed for a predetermined amount of time in order to expose a surface of barrier layer 11.

At step 230, once a barrier layer 11 is exposed at a second time reference ($t_2$), a second biasing potential (V2) is applied to electrical contact surface 616 for a second time period ($t_c$), while the substrate 122 is in a polishing station (e.g., polishing station 130). At step 235, the substrate is processes as V2 is continuously applied to electrical contact surface 616 of the substrate 122 in an ECMP polishing station (e.g., polishing station 130). The higher voltage V2 will result in higher polarization, and compensates for the voltage (IR) drop across the barrier layer 11 that has a low conductivity. Thus, by applying this second biasing potential, copper polarization may be increased to its second passivation potential to make copper surface more passive. Due to the higher polarization, the exposed material surface (e.g., copper) in features 13 remains in a high passivation state, while the material residue (e.g., copper residue) on barrier layer 11 is still in active dissolution state. In this way, dishing is minimized and copper cleaning efficiency may be increased. In one embodiment of the present invention, V2 is substantially equal to 2.3V.

Once the entire barrier layer 11 is exposed at a third time reference ($t_3$), a third biasing potential (V3) is applied to electrical contact surface 616, at step 240. As illustrated in FIG. 7, this third bias voltage (V3) may be negative and may be applied for a third (possibly brief) time period ($T_d$), before a substrate 122 is removed from the polishing station, at step 250. The value of V3 (and duration time $T_d$) may be selected in an effort to neutralize the charge built up on the surface of the substrate and reduce any possibility of local pitting and Sn (metal) transfer that could result from the charge built up during the processing steps. In one embodiment of the present invention, V3 is substantially equal to −190 mV. Once the substrate is removed, at a fourth time reference ($t_4$), the applied voltage on the electrical contact surface 616 may again return to zero. As illustrated, the processing steps 210-250 may be repeated as necessary, at step 260, for subsequent substrates.

CONCLUSION

By utilizing multiple polishing steps and applying different voltages, while a substrate is in an ECMP polishing station, ECMP can be used to effectively reduce dishing and improve residual cleaning.

Although the embodiment disclosed above, which incorporates the teaching of the present invention, has been shown and described in detail herein, those skilled in the art can readily devise other varied embodiments which still incorporate the teachings and do not depart from the spirit of the invention.

The invention claimed is:

1. A method for electrochemical mechanical polishing of a substrate having a dielectric feature, a barrier layer comprising a barrier material disposed on the dielectric feature, and a conductive material disposed on the barrier material, the method comprising:
    prior to exposing the barrier layer, polishing the conductive material while applying a first biasing potential across a conductive surface of the substrate and a counter electrode to expose the barrier material; and
    after the barrier layer is at least partially exposed, polishing the conductive material while applying a second biasing potential across a conductive surface of the substrate and the counter electrode, wherein the second biasing potential is selected to compensate for a potential drop across the barrier material.

2. The method of claim 1, further comprising:
    applying a third biasing potential to discharge an accumulated charge on the surface of the substrate prior to separating the substrate from a polishing pad.

3. The method of claim 1, wherein the polishing is performed in a single electrochemical mechanical polishing station.

4. The method of claim 1, wherein the conductive material is copper.

5. The method of claim 1, wherein the first biasing potential corresponds to a first passivation state of a conductive material surface on the conductive material and the second biasing potential corresponds to a second passivation state of the conductive material surface on the conductive material.

6. The method of claim 1, wherein the first biasing potential corresponds to a value at which the conductive material reaches or approaches a maximum anodic dissolution.

7. The method of claim 1, wherein the second biasing potential is greater than the first biasing potential to compensate for the potential drop across the barrier material.

8. The method of claim 1, further comprising:
    polishing the conductive material until the barrier material is partially exposed, while applying the first biasing potential across the conductive surface.

9. The method of claim 1, further comprising:
    polishing the conductive material until the barrier material is fully exposed, while applying the second biasing potential across the conductive surface.

10. The method of claim 1, wherein the conductive material is tungsten.

11. The method of claim 1, wherein the first biasing potential is substantially equal to 2.0 volts.

12. The method of claim 1, wherein the second biasing potential is substantially equal to 2.3 volts.

13. A method for electrochemical mechanical polishing of a substrate having a dielectric feature, a barrier layer comprising a barrier material disposed on the dielectric feature, and a conductive material disposed on the barrier material, the method comprising:
    prior to exposing the barrier layer, polishing the conductive material while applying a first biasing potential across a conductive surface of the substrate and a counter electrode to expose the barrier material, wherein the first biasing potential corresponds a first passivation state of the conductive material layer;
    after the barrier layer is at least partially exposed, polishing the conductive material while applying a second biasing potential across a conductive surface of the substrate and the counter electrode, wherein the second biasing potential corresponds to a second passivation state of the conductive material layer; and applying a third biasing potential to discharge an accumulated charge from a surface of a polishing pad.

14. The method of claim 13, wherein the third biasing potential corresponds to a negative biasing potential.

15. The method of claim 13, wherein the third biasing potential is substantially equal to −190 millivolts.

16. The method of claim 13, wherein the first biasing potential corresponds to a value at which the conductive material reaches or approaches a maximum anodic dissolution.

* * * * *